United States Patent
Yoshioka et al.

(10) Patent No.: US 9,625,500 B2
(45) Date of Patent: Apr. 18, 2017

(54) A/D CONVERTER, ANALOG FRONT END, AND SENSOR SYSTEM

(71) Applicant: KABUSHIKI KAISHA TOSHIBA, Minato-ku (JP)

(72) Inventors: Kentaro Yoshioka, Setagaya (JP); Tetsuro Itakura, Nerima (JP); Masanori Furuta, Odawara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/244,353

(22) Filed: Aug. 23, 2016

(65) Prior Publication Data

US 2017/0059631 A1    Mar. 2, 2017

(30) Foreign Application Priority Data

Aug. 24, 2015 (JP) ................................ 2015-165002

(51) Int. Cl.
- *H03M 1/12* (2006.01)
- *G01R 19/252* (2006.01)
- *H03M 1/46* (2006.01)

(52) U.S. Cl.
CPC ............ *G01R 19/252* (2013.01); *H03M 1/46* (2013.01)

(58) Field of Classification Search
CPC .......... H03M 1/46; H03M 3/424; H03M 1/12; H03M 1/00; H03M 3/458; H03M 1/001;

(Continued)

(56) References Cited

U.S. PATENT DOCUMENTS 5,973,631 A * 10/1999 McMullen .......... H03M 1/1057
                                                              341/121
6,222,477 B1    4/2001 Irie et al.
(Continued)

FOREIGN PATENT DOCUMENTS

JP        2000-236255 A    8/2000
JP           3407193 B2    3/2003

OTHER PUBLICATIONS

Yunzhi Dong, et al., "A Continuous-Time 0-3 MASH ADC Achieving 88 dB DR With 53 MHz BW in 28 nm CMOS", IEEE Journal of Solid-State Circuits. vol. 49, No. 12, 2014, pp. 2868-2877.
(Continued)

*Primary Examiner* — Jean B Jeanglaude
(74) *Attorney, Agent, or Firm* — Oblon, McClelland, Maier & Neustadt, L.L.P.

(57) ABSTRACT

An A/D converter has an analog input terminal, an analog output terminal, a digital output terminal, a first resistance comprising one end connected to the analog input terminal or a reference voltage line and another end connected to a first node, a second resistance comprising one end connected to the first node and another end connected to the analog output terminal, an operational amplifier comprising a first input terminal connected to the first node, a second input terminal connected to the reference voltage line or the analog input terminal, and an output terminal connected to the analog output terminal, a quantizer comprising an input terminal connected to the analog input terminal and an output terminal connected to the digital output terminal, and a DA converter comprising an input terminal connected to the digital output terminal and an output terminal connected to the first node.

19 Claims, 11 Drawing Sheets

(58) Field of Classification Search
CPC ........ H03M 3/30; H03M 3/50; H03M 7/3004;
H03M 2201/13; G01R 19/252
USPC .............................. 341/110, 121, 155, 143
See application file for complete search history.

(56) References Cited

U.S. PATENT DOCUMENTS

| | | | | |
|---|---|---|---|---|
| 8,466,820 | B2* | 6/2013 | Dosho | H03M 3/344 |
| | | | | 341/143 |
| 9,240,801 | B2* | 1/2016 | Marienborg | H03M 3/424 |
| 2003/0080888 | A1* | 5/2003 | Muhammad | H03M 3/47 |
| | | | | 341/143 |
| 2013/0249718 | A1* | 9/2013 | Dosho | H03M 3/344 |
| | | | | 341/110 |

OTHER PUBLICATIONS

"Understanding Pipelined ADCs", Maxim Integrated Products, 2001, pp. 1-8.
"ADC", Matsuzawa Lab., Tokyo Institute of Technology, 2006, pp. 1-25.

* cited by examiner

A/D CONVERTER, ANALOG FRONT END, AND SENSOR SYSTEM

CROSS REFERENCE TO RELATED APPLICATIONS

This application is based upon and claims the benefit of priority from the prior Japanese Patent Application No. 2015-165002, filed on Aug. 24, 2015, the entire contents of which are incorporated herein by reference.

FIELD

Embodiments of the present invention relate to an A/D converter, an analog front end, and a sensor system.

BACKGROUND

A conventional analog front end of a sensor has a variable gain amplifier, an A/D converter, and a buffer for driving an input capacitor of the A/D converter. As the resolution of the sensor becomes higher, the input capacitor of the A/D converter becomes larger, which leads to an increase in the power consumption of the buffer, i.e., an increase in the power consumption of the analog front end as a whole.

DETAILED DESCRIPTION

Figure 1:
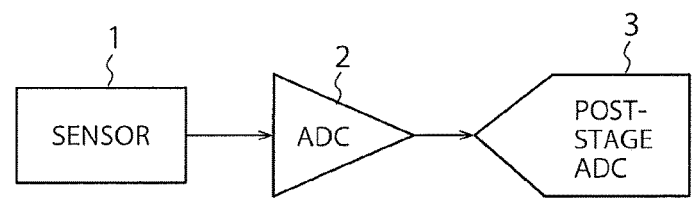
FIG. 1 is a diagram showing an example of a sensor system according to a first embodiment.

According to one embodiment, an A/D converter has:
an analog input terminal to input an analog input signal;
an analog output terminal to output an analog output signal;
a digital output terminal to output a digital output signal;
a first resistance comprising one end connected to the analog input terminal or a reference voltage line and another end connected to a first node;
a second resistance comprising one end connected to the first node and another end connected to the analog output terminal;
an operational amplifier comprising a first input terminal connected to the first node, a second input terminal connected to the reference voltage line or the analog input terminal, and an output terminal connected to the analog output terminal;
a quantizer comprising an input terminal connected to the analog input terminal and an output terminal connected to the digital output terminal; and
a DA converter comprising an input terminal connected to the digital output terminal and an output terminal connected to the first node.

Hereinafter, embodiments of the present invention will be explained referring to the drawings.

First Embodiment

A sensor system according to a first embodiment will be explained referring to FIGS. 1 to 11. FIG. 1 is a diagram showing an example of the sensor system according to the present embodiment. As shown in FIG. 1, the sensor system has a sensor 1, an A/D converter 2, and a post-stage A/D converter 3.

The sensor 1 outputs an analog signal depending on a measurement result. The sensor 1 is e.g. a sonic sensor, a temperature sensor, or a gas sensor, but should not be limited thereto.

An A/D converter (ADC) 2 is inputted with an analog signal outputted by the sensor 1 as an input signal. The A/D converter 2 performs A/D conversion on the input signal, and outputs a digital signal and a residual signal, the digital signal depending on the input signal. The A/D converter 2 has an operational amplifier, and functions as a pipeline stage operating in continuous time.

Although not shown in the drawings, the sensor system has e.g. a variable gain amplifier (VGA) for amplifying the output signal of the sensor 1, a buffer for driving a capacitor of the post-stage ADC 3, a filter such as an anti-aliasing filter, etc. (hereinafter, referred to as "VGA etc.") The A/D converter 2 according to the present embodiment is formed by adding a quantizer and a DA converter (to be described later) to an operational amplifier of the VGA etc.

This A/D converter 2 has redundancy. That is, the digital signal outputted by the A/D converter 2 has redundant bits. The A/D converter 2 has a resolution of e.g. 1.5 bits, 2.5 bits, or 3.5 bits, but the resolution should not be limited thereto. The A/D converter 2 will be explained in detail later.

The post-stage A/D converter (post-stage ADC) 3 is inputted with the residual signal outputted by the A/D converter 2 as an input signal. The post-stage A/D converter 3 performs A/D conversion on the input signal, and outputs a digital signal depending on the input signal. The post-stage A/D converter 3 is e.g. a pipeline A/D converter, a flash A/D converter, a ΔΣ A/D converter, or a successive approximation A/D converter, but should not be limited thereto. The A/D converter 2 and post-stage A/D converter 3 are included in an analog front end (AFE) of the sensor system.

The digital signal depending on the analog signal outputted by the sensor 1 is generated by summing up the digital signal outputted by the A/D converter 2 and the digital signal outputted by the post-stage A/D converter 3.

Figure 2:
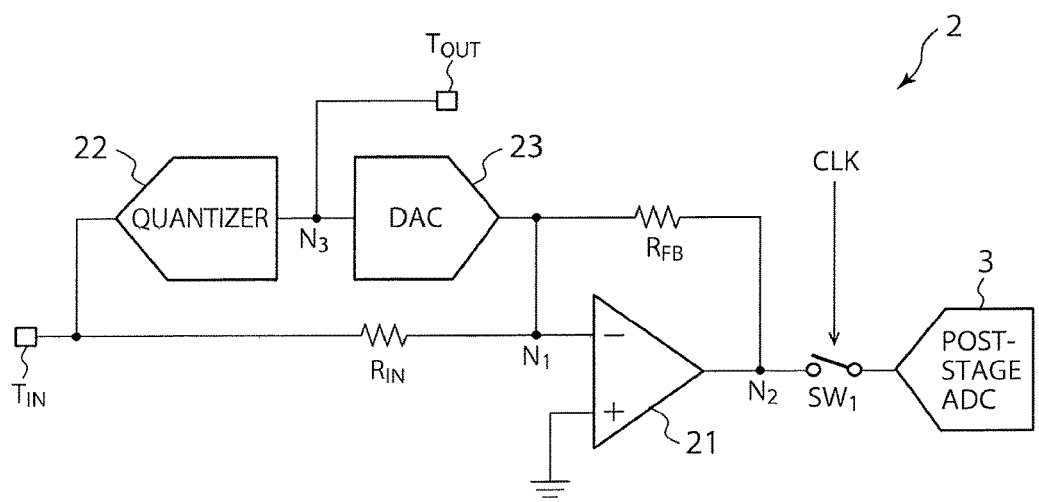
FIG. 2 is a diagram showing an example of an analog front end according to the first embodiment.

FIG. 2 is a diagram showing an example of an AFE according to the present embodiment. As shown in FIG. 2, the AFE has the A/D converter 2, a switch $SW_1$, and the post-stage ADC 3. The post-stage ADC 3 is formed as described above. Hereinafter, the A/D converter 2 will be explained.

As shown in FIG. 2, the A/D converter 2 has an analog input terminal $T_{IN}$, an input resistance $R_{IN}$, a feedback resistance $R_{FB}$, an operational amplifier 21, a digital output terminal $T_{OUT}$, a quantizer 22, and a DA converter 23. The following explanation is based on the definition that the A/D converter 2 has a resolution of 1.5 bits. The analog input terminal $T_{IN}$ (hereinafter referred to as "input terminal $T_{IN}$") is connected to an output terminal of the sensor 1, and inputted with an analog input signal from the sensor 1. The analog input signal may be a voltage signal $V_{IN}$, or may be a current signal $I_{IN}$. In the following explanation, the analog input signal is defined as the voltage signal $V_{IN}$, and referred to as an input signal $V_{IN}$.

The input resistance $R_{IN}$ (first resistance) has one end connected to the input terminal $T_{IN}$ and the other end connected to a node $N_1$ (first node). In FIG. 2, the node $N_1$ is a connecting path of the input resistance $R_{IN}$, feedback resistance $R_{FB}$, operational amplifier 21, and DA converter 23. The input resistance $R_{IN}$ has a resistance value of $R_{IN}$.

The feedback resistance $R_{FB}$ (second resistance) has one end connected to the node $N_1$ and the other end connected to a node $N_2$. The node $N_2$ is a connecting path of the feedback resistance $R_{FB}$, operational amplifier 21, and switch $SW_1$. In FIG. 2, the node $N_2$ corresponds to an analog output terminal of the A/D converter 2. That is, the A/D converter 2 outputs the residual signal from the node $N_2$ as an analog output signal. The feedback resistance $R_{FB}$ has a resistance value of $2R_{IN}$.

The switch $SW_1$ is a switch for connecting or disconnecting the A/D converter 2 and post-stage A/D converter 3. The switch $SW_1$ has one end connected to the node $N_2$ and the other end connected to an input terminal of the post-stage A/D converter 3. The switch $SW_1$ is turned on and off based on the control by a clock CLK.

While the clock CLK is 1 (HIGH), the switch $SW_1$ is turned on, by which the residual signal of the A/D converter 2 is sampled by the post-stage A/D converter 3. Further, while the clock CLK is 0 (LOW), the switch $SW_1$ is turned off, and the post-stage A/D converter 3 performs A/D conversion on the sampled residual signal. Note that, the switch $SW_1$ may be turned off while the clock CLK is 1 and turned on while the clock CLK is 0.

The operational amplifier 21 has an inverting input terminal (first input terminal) connected to the node $N_1$, a non-inverting input terminal (second input terminal) connected to a reference voltage line, and an output terminal connected to the node $N_2$. In the example of FIG. 2, the reference voltage line is a ground line, but should not be limited thereto. As described above, an operational amplifier of the VGA etc. is utilized as the operational amplifier 21.

Figure 3:
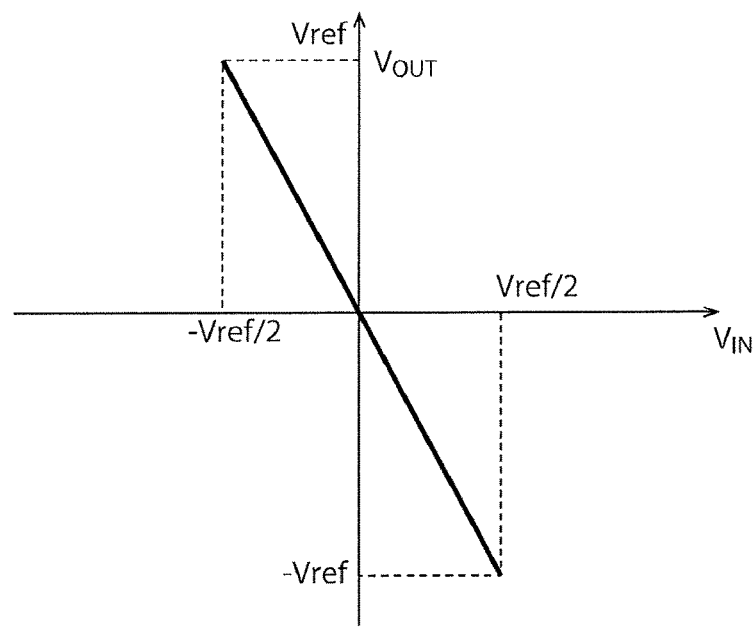
FIG. 3 is a graph showing transmission characteristics of an inverting amplifier circuit.

In the present embodiment, the input resistance $R_{IN}$, feedback resistance $R_{FB}$, and operational amplifier 21 are included in an inverting amplifier circuit. Since the feedback resistance $R_{FB}$ has a resistance value of $2R_{IN}$, an amplification factor A of this inverting amplifier circuit is doubled. FIG. 3 is a graph showing transmission characteristics of this inverting amplifier circuit. As shown in FIG. 3, an output signal $V_{OUT}$ from the inverting amplifier circuit is a signal obtained by inverting the input signal $V_{IN}$ and amplifying it to double.

Note that resistance values of the input resistance $R_{IN}$ and feedback resistance $R_{FB}$ should be set so that $R_{FB}=4 R_{IN}$ when the A/D converter 2 has a resolution of 2.5 bits, and so that $R_{FB}=8R_{IN}$ when the A/D converter 2 has a resolution of 3.5 bits. This means that the amplification factor A of the inverting amplifier circuit becomes 4 times larger and 8 times larger in the respective cases.

Further, when the input signal is the current signal $I_{IN}$, the voltage $V_{IN}$ of the input terminal $T_{IN}$ is obtained by multiplying $I_{IN}$ by $R_{IN}$. This is because the inverting input terminal of the operational amplifier 21 serves as a virtual ground point.

The digital output terminal $T_{OUT}$ (hereinafter referred to as "output terminal $T_{OUT}$") is connected to a node $N_3$. In FIG. 2, the node $N_3$ is a connecting path of the output terminal $T_{OUT}$, quantizer 2, and DA converter 23. The digital output terminal $T_{OUT}$ outputs a digital signal $D_{OUT}$ outputted by the quantizer 22.

The quantizer 22 has an input terminal connected to the input terminal $T_{IN}$ and an output terminal connected to the node $N_3$. The quantizer 22 quantizes the input signal $V_{IN}$, and outputs the digital signal $D_{OUT}$ depending on the input signal $V_{IN}$.

Figure 4:
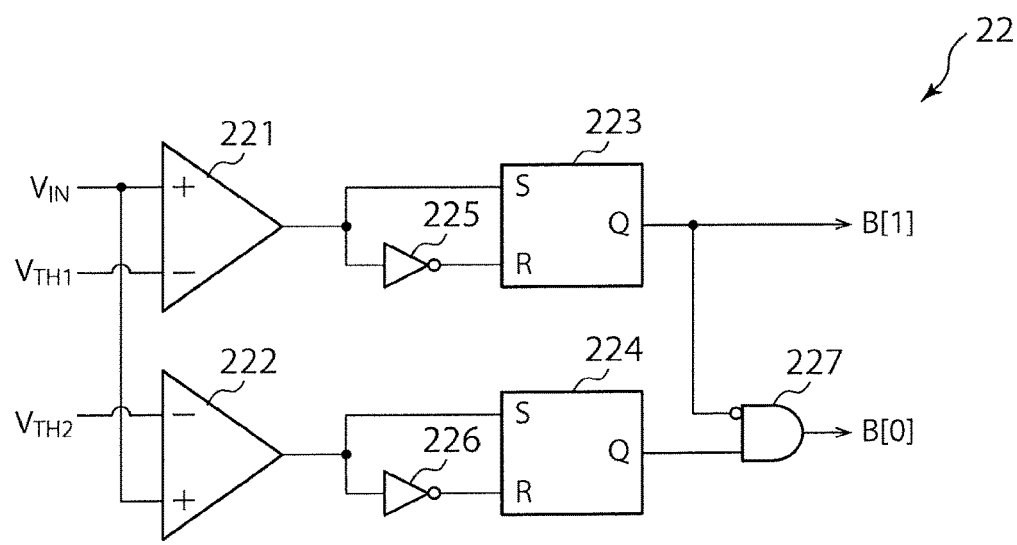
FIG. 4 is a diagram showing an example of a quantizer of FIG. 2.

FIG. 4 is a diagram showing an example of the quantizer 22. When the A/D converter 2 has a resolution of 1.5 bits, the quantizer 22 compares the input signal $V_{IN}$ with two threshold voltages VTH1 and VTH2 ($V_{TH1}>V_{TH2}$). When the input-output range of the A/D converter 2 is from −Vref to Vref, $V_{TH1}$=Vref/4 and $V_{TH2}$=−Vref/4, for example. As shown in FIG. 4, this quantizer 22 has comparators 221 and 222, SR latches 223 and 224, NOT gates 225 and 226, and an AND gate 227.

The comparator 221 is inputted with the input signal $V_{IN}$ and threshold voltage $V_{TH1}$. The comparator 221 outputs 1 (HIGH) when $V_{IN}$ is greater than $V_{TH1}$, and outputs 0 (LOW) when $V_{IN}$ is less than $V_{TH1}$.

The comparator 222 is inputted with the input signal $V_{IN}$ and threshold voltage $V_{TH2}$. The comparator 222 outputs 1 when $V_{IN}$ is less than $V_{TH2}$, and outputs 0 when $V_{IN}$ is greater than $V_{TH2}$.

The SR latch 223 has an S terminal inputted with the output (1 or 0) of the comparator 221, an R terminal inputted with an inverted output signal of the comparator 221, and a Q terminal outputting 1 or 0. The output signal of the SR latch 223 corresponds to the 1st bit (B[1]) of the digital signal $D_{OUT}$. Here, when defining that the values inputted into the S terminal and R terminal are S and R respectively and the value outputted from the Q terminal is Q, Q becomes 0 when S=0 and R=1, and Q becomes 1 when S=1 and R=0. Further, Q remains the same when S=0 and R=0.

The SR latch 224 has an S terminal inputted with the output signal of the comparator 222 (1 or 0), an R terminal inputted with an inverted output signal of the comparator 222, and a Q terminal outputting 1 or 0. Q becomes 0 when S=0 and R=1, and Q becomes 1 when S=1 and R=0. Further, Q remains the same when S=0 and R=0.

The NOT gate 225 is inputted with the output signal of the comparator 221, and outputs an inverted signal thereof. The output signal of the NOT gate 225 is inputted into the R terminal of the SR latch 223.

The NOT gate 226 is inputted with the output signal of the comparator 222, and outputs an inverted signal thereof. The output signal of the NOT gate 226 is inputted into the R terminal of the SR latch 224.

The AND gate 227 is inputted with an inverted output of the SR latch 223, and inputted with the output of the SR latch 224. The output signal of the AND gate 227 becomes 1 when Q=0 in the SR latch 223 and Q=1 in the SR latch 224, and becomes 0 in the other cases. The output signal of the AND gate 227 corresponds to the 2nd bit (B[0]) of the digital signal $D_{OUT}$.

When the input signal $V_{IN}$ inputted into this quantizer 22 is greater than $V_{TH1}$, the SR latch 223 outputs 1, and the AND gate 227 outputs 0. That is, B[1:0] having a value of 10 is outputted as the digital signal $D_{OUT}$.

When $V_{IN}$ is greater than $V_{TH2}$ and less than $V_{TH1}$, the SR latch 223 outputs 0, and the AND gate 227 outputs 1. That is, B[1:0] having a value of 01 is outputted as the digital signal $D_{OUT}$.

When $V_{IN}$ is less than $V_{TH2}$, the SR latch 223 outputs 0, and the AND gate 227 outputs 0. That is, B[1:0] having a value of 00 is outputted as the digital signal $D_{OUT}$.

As stated above, the quantizer 22 outputs the digital signal $D_{OUT}$ having a value of any one of 10, 01, and 00 depending on the input signal $V_{IN}$ in continuous time.

Figure 5:
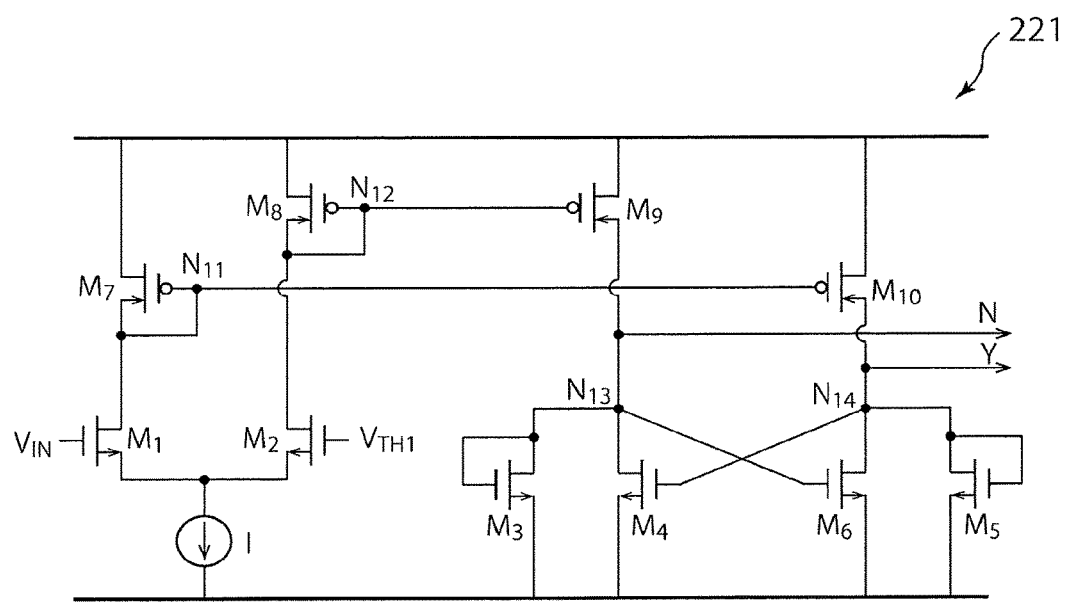
FIG. 5 is a diagram showing an example of a comparator of FIG. 4

FIG. 5 is a diagram showing an example of the comparator 221 of FIG. 4. The comparator 221 of FIG. 5 has transistors $M_1$ to $M_{10}$ and a current supply I. The transistors $M_1$ to $M_6$ are N-channel MOS transistors, and the transistors $M_7$ to $M_{10}$ are P-channel MOS transistors.

The transistor $M_1$ has a source terminal connected to the current supply I, a drain terminal connected to a node $N_{11}$, and a gate terminal applied with the input voltage (input signal) $V_{IN}$. The transistor $M_2$ has a source terminal connected to the current supply I, a drain terminal connected to a node $N_{12}$, and a gate terminal applied with the threshold voltage $V_{TH1}$.

The transistor $M_3$ has a source terminal connected to a ground line, and a drain terminal and a gate terminal each connected to a node $N_{13}$. The transistor $M_4$ has a source terminal connected to the ground line, a drain terminal connected to the node $N_{13}$, and a gate terminal connected to a node $N_{14}$.

The transistor $M_5$ has a source terminal connected to the ground line, and a drain terminal and a gate terminal each connected to the node $N_{14}$. The transistor $M_6$ has a source terminal connected to the ground line, a drain terminal connected to the node $N_{14}$, and a gate terminal connected to the node $N_{13}$.

The transistor $M_7$ has a source terminal and a gate terminal each connected to the node $N_{11}$, and a drain terminal connected to a power-supply line. The transistor $M_8$ has a source terminal and a gate terminal each connected to the node $N_{12}$, and a drain terminal connected to the power-supply line.

The transistor $M_9$ has a source terminal connected to the node $N_{13}$, a drain terminal connected to the power-supply line, and a gate terminal connected to the node $N_{12}$. The transistor $M_{10}$ has a source terminal connected to the node $N_{14}$, a drain terminal connected to the power-supply line, and a gate terminal connected to the node $N_{11}$.

In the example of FIG. 5, the voltage of the node $N_{14}$ corresponds to an output signal (Y) of the comparator 221, and the voltage of the node $N_{13}$ corresponds to an inverted output signal (N) of the comparator 221.

Note that the comparator 222 can be formed similarly to FIG. 5. In this case, the threshold voltage $V_{TH2}$ is applied to the gate terminal of the transistor $M_1$ and the input voltage $V_{IN}$ is applied to the gate terminal of the transistor $M_2$.

Further, the input signal $V_{IN}$ may be inputted into the transistors M1 and M2 having different device sizes to achieve a differential input, instead of applying the threshold voltages VTH1 and VTH2 thereto. This makes it possible to realize the comparators 221 and 222 of FIG. 4, which is because the A/D converter 2 having a resolution of 1.5 bits has a high redundancy and thus high accuracy is not required for the threshold voltages VTH1 and VTH2.

The DA converter 23 has an input terminal connected to the node $N_3$, and an output terminal connected to the node $N_1$. The DA converter 23 is inputted with the digital signal $D_{OUT}$ (B[1:0]) from the quantizer 22, and outputs an analog signal depending on the inputted digital signal $D_{OUT}$.

Figure 6:
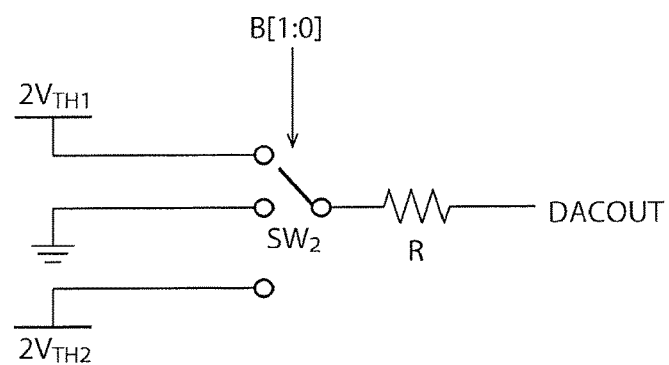
FIG. 6 is a diagram showing an example of a DA converter of FIG. 2.

FIG. 6 is a diagram showing an example of the DA converter 23. As shown in FIG. 5, the DA converter 23 has three voltage sources, a switch $SW_2$, and a resistance R.

In the example of FIG. 6, voltages of the three voltage sources correspond to $2V_{TH1}$, reference voltage, and 2VTH2, respectively. This is because the amplification factor of the inverting amplifier circuit formed using the operational amplifier 21 is doubled.

The switch $SW_2$ has one end which can be switched among the three voltage sources, and the other end connected to one end of the resistance R. Switching of the switch $SW_2$ is controlled by the digital signal $D_{OUT}$ (B[1:0]) of the quantizer 22. The switch $SW_2$ is connected to the voltage source having a voltage of $2V_{TH2}$ when B[1:0]=10, connected to the reference voltage line when B[1:0]=01, and connected to the voltage source having a voltage of $2V_{TH1}$ when B[1:0]=00.

The resistance R has one end connected to the other end of the switch $SW_2$, and the other end connected to the node $N_1$. Therefore, the voltage of the other end of the resistance R becomes the reference voltage. The resistance R outputs an output current DACOUT depending on the digital signal $D_{OUT}$ of the quantizer 22. Accordingly, the output current DACOUT depending on the digital signal $D_{OUT}$ is subtracted from the current depending on the input signal $V_{IN}$ ($=V_{IN}/R_{IN}$), and current depending on the residual signal is supplied to the feedback resistance $R_{FB}$. The current depending on the residual signal is converted into voltage by the feedback resistance $R_{FB}$ to generate a residual signal $V_{OUT}$.

Here, the operation of the A/D converter 2 according to the present embodiment will be explained. The following explanation is based on the definition that the input-output range of the A/D converter 2 is from −Vref to Vref, $V_{TH1}$=Vref/4, and $V_{TH2}$=−Vref/4.

When the input signal $V_{IN}$ is greater than Vref/4, the quantizer 22 outputs B[1:0] having a value of 10, and the switch $SW_2$ of the DA converter 23 is connected to the voltage source having a voltage of −Vref/2 to supply current depending on B[1:0] having a value of 10.

When the input signal $V_{IN}$ is greater than −Vref and less than Vref/4, the quantizer 22 outputs B[1:0] having a value of 01, and the switch $SW_2$ of the DA converter 23 is connected to the reference voltage line.

When the input signal $V_{IN}$ is less than −Vref/4, the quantizer 22 outputs B[1:0] having a value of 00, and the switch $SW_2$ of the DA converter 23 is connected to the voltage source having a voltage of Vref/2 to supply current depending on B[1:0] having a value of 00.

Figure 7:
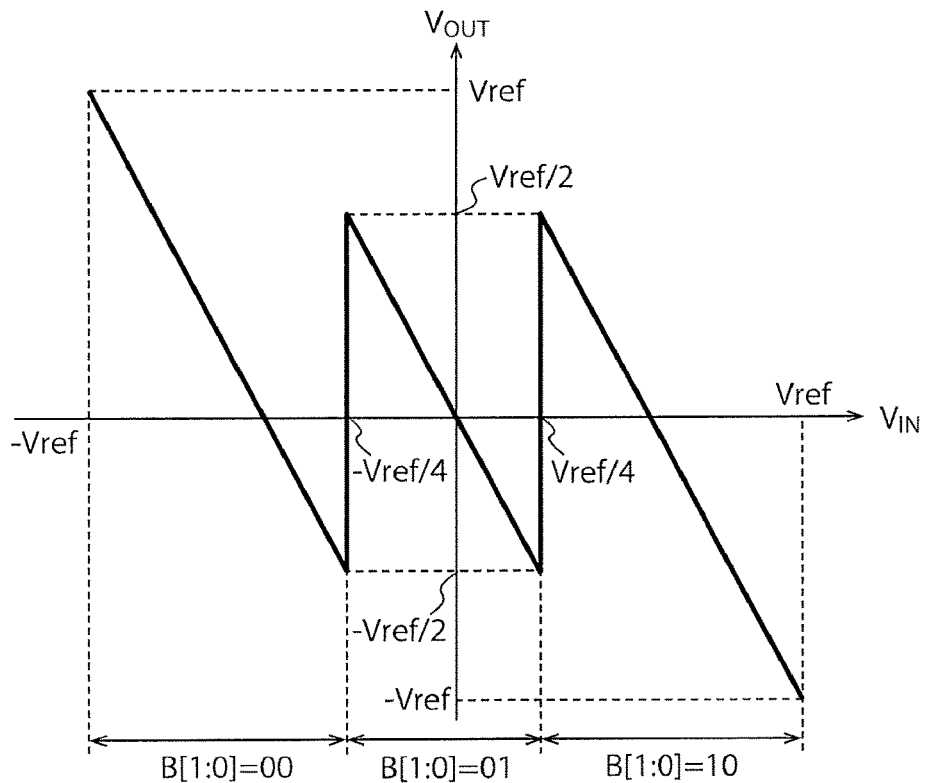
FIG. 7 is a graph showing transmission characteristics of an A/D converter according to the first embodiment.

When comprehensively considering the above operation of the quantizer 22 and DA converter 23 and the transmission characteristics of the inverting amplifier circuit formed using the operational amplifier 21 (see FIG. 3), transmission characteristics of the A/D converter 2 can be expressed as shown in FIG. 7. That is, when the input signal $V_{IN}$ is greater than −Vref and less than −Vref/4, the residual signal (output voltage) $V_{OUT}$ becomes greater than −Vref/2 and less than Vref. When the input signal $V_{IN}$ is greater than −Vref/4 and less than Vref/4, the residual signal $V_{OUT}$ becomes greater than −Vref/2 and less than Vref/2. When the input signal $V_{IN}$ is greater than Vref/4 and less than Vref, the residual signal $V_{OUT}$ becomes greater than −Vref and less than Vref/2.

Figure 8:
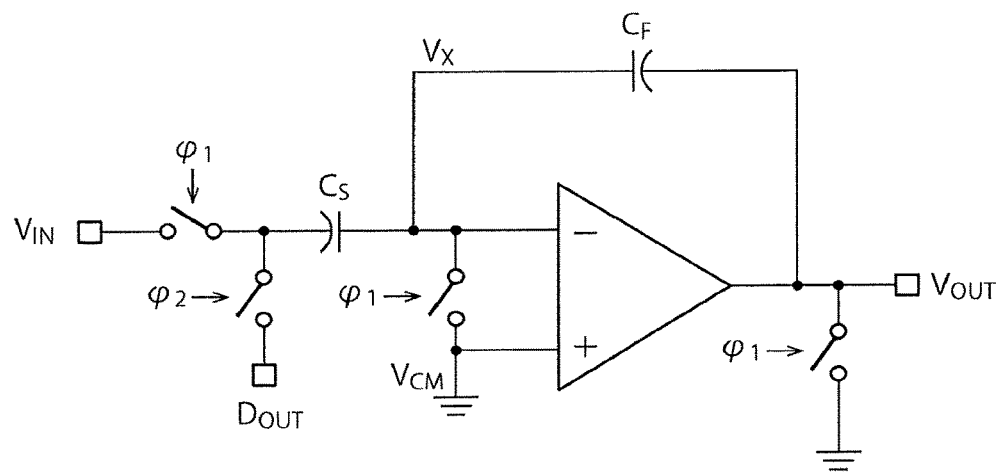
FIG. 8 is a diagram showing an example of a conventional pipeline stage.

Here, FIG. 8 is a diagram showing an example of a conventional pipeline stage. The pipeline stage of FIG. 8 has an operational amplifier, a feedback capacitor $C_F$, and a switched capacitor circuit having a sampling capacitor $C_S$. Each switch is controlled by a control signal $\phi_1$ or $\phi_2$. When the control signal $\phi_1$ is turned on, the input signal $V_{IN}$ is sampled, and when the control signal $\phi_2$ is turned on, charge depending on the digital signal $D_{OUT}$ is extracted from the charge accumulated in the sampling capacitor $C_S$ and residual charge is transferred to the feedback capacitor $C_F$ to output the residual signal $V_{OUT}$. When the pipeline stage has a resolution of 1.5 bits, the amplification factor A of the pipeline stage is set to $C_S/C_F$ (=2), and the transmission characteristics thereof can be expressed as shown in FIG. 9.

That is, when the input signal $V_{IN}$ is greater than −Vref and less than −Vref/4, the residual signal $V_{OUT}$ becomes greater than −Vref and less than Vref/2. When the input signal $V_{IN}$ is greater than −Vref/4 and less than Vref/4, the residual signal $V_{OUT}$ becomes greater than −Vref/2 and less than Vref/2. When the input signal $V_{IN}$ is greater than Vref/4 and less than Vref, the residual signal $V_{OUT}$ becomes greater than −Vref/2 and less than Vref.

Figure 9:
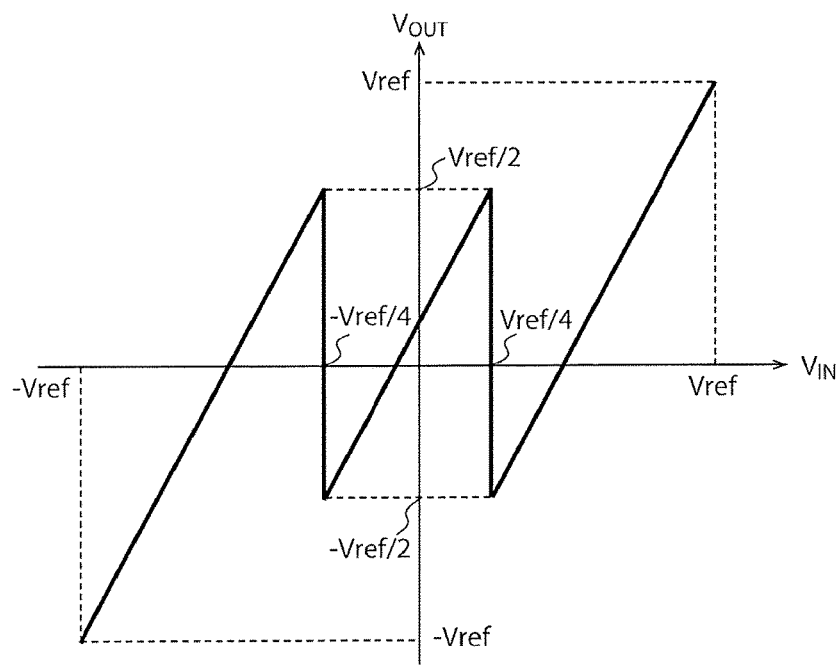
FIG. 9 is a diagram showing transmission characteristics of the conventional pipeline stage.

As will be understood from FIG. 7 and FIG. 9, the transmission characteristics of the A/D converter 2 according to the present embodiment are in inverse relation to the transmission characteristics of the conventional pipeline stage. Therefore, this shows that a residual signal similar to that of the conventional pipeline stage can be obtained by inverting the residual signal of the A/D converter 2 $V_{OUT}$.

The A/D conversion result of the input signal $V_{IN}$ is obtained by summing up the digital signal $D_{OUT}$ outputted by the A/D converter 2 and an inverted digital signal of the digital signal obtained by performing A/D conversion on the residual signal $V_{OUT}$ by the post-stage A/D converter 3. Note that the residual signal $V_{OUT}$ previously inverted may be inputted into the post-stage A/D converter 3. In this case, the A/D conversion result of the input signal $V_{IN}$ is obtained by summing up the digital signal $D_{OUT}$ and the A/D conversion result of the post-stage A/D converter 3.

As explained above, the A/D converter 2 according to the present embodiment can be formed by adding the quantizer 22 and DA converter 23 to the operational amplifier 21 included in the AFE of the sensor system. Performing A/D conversion on the input signal $V_{IN}$ by this A/D converter 2 makes it possible to reduce the resolution of the post-stage A/D converter 3. Concretely, when the A/D converter 2 has a resolution of N bits, the resolution of the post-stage A/D converter 3 can be reduced by N bits.

Generally, when the resolution of the post-stage A/D converter 3 is reduced by 1 bit, power consumption of the post-stage A/D converter 3 is reduced by half. When the performance of the post-stage A/D converter 3 is restricted due to thermal noise etc., reduction in the resolution by 1 bit reduces the power consumption of the post-stage A/D converter 3 to about a quarter.

Since the A/D converter 2 according to the present embodiment is obtained by adding the quantizer 22 and DA converter 23 to the operational amplifier of the VGA etc., the power consumption of the VGA etc. increases. However, each of the quantizer 22 and DA converter 23 generally consumes low power. That is, the A/D converter 2 can be formed with overheads intended for low power consumption.

As described above, the A/D converter 2 formed using the VGA etc. makes it possible to considerably reduce the power consumption of the post-stage A/D converter 3. As a result, the A/D converter 2 according to the present embodiment can reduce the power consumption of the AFE as a whole. Therefore, the AFE and sensor system of low power consumption can be formed.

Note that, in the present embodiment, at least one of the input resistance $R_{IN}$ and feedback resistance $R_{FB}$ may have a variable resistance value. For example, $R_{IN}$ can be made variable by forming the input resistance $R_{IN}$ using a plurality of resistances and switching, by a switch, a resistance to be connected as the input resistance $R_{IN}$. The switch should be controlled by a digital signal. The same can be applied to the feedback resistance $R_{FB}$.

Such a configuration makes it possible to make the amplification factor A of the inverting amplifier circuit variable to make the A/D converter 2 function as a VGA, and to make the resolution of the A/D converter 2 variable. For example, changing $R_{FB}$ from $2R_{IN}$ to $4R_{IN}$ makes it possible to change the amplification factor A from two times to four times and to change the resolution from 1.5 bits to 2.5 bits.

Figure 10:
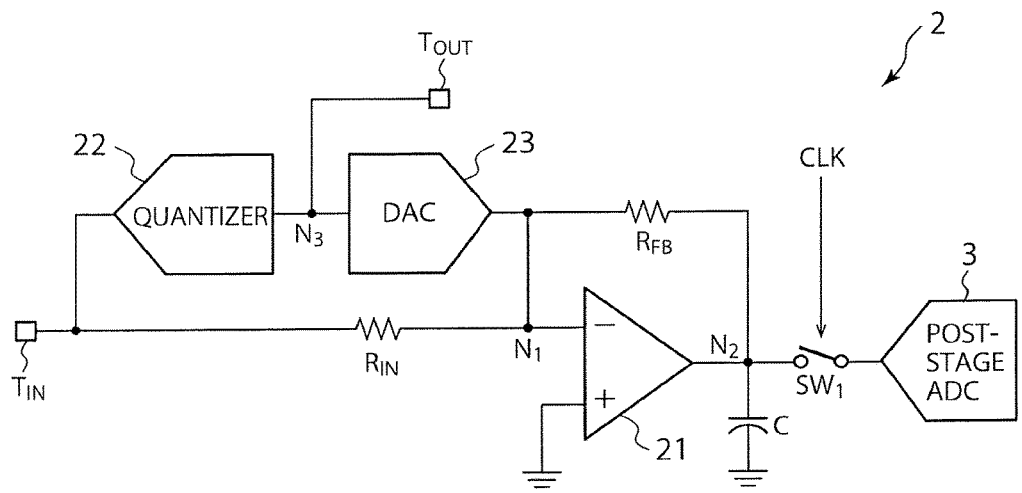
FIG. 10 is a diagram showing a modification example of the analog front end according to the first embodiment.

Further, as shown in FIG. 10, a capacitor C may be connected between the node $N_2$ (analog output terminal) and reference voltage line. The capacitor C has one end connected to the node $N_2$ and the other end connected to the reference voltage line.

Such a configuration makes it possible to make the A/D converter 2 function as an anti-aliasing filter (low-pass filter). In the example of FIG. 10, the A/D converter 2 is a first-order lowpass filter, but may be a high-order filter, a highpass filter, or a band pass filter instead.

Figure 11:
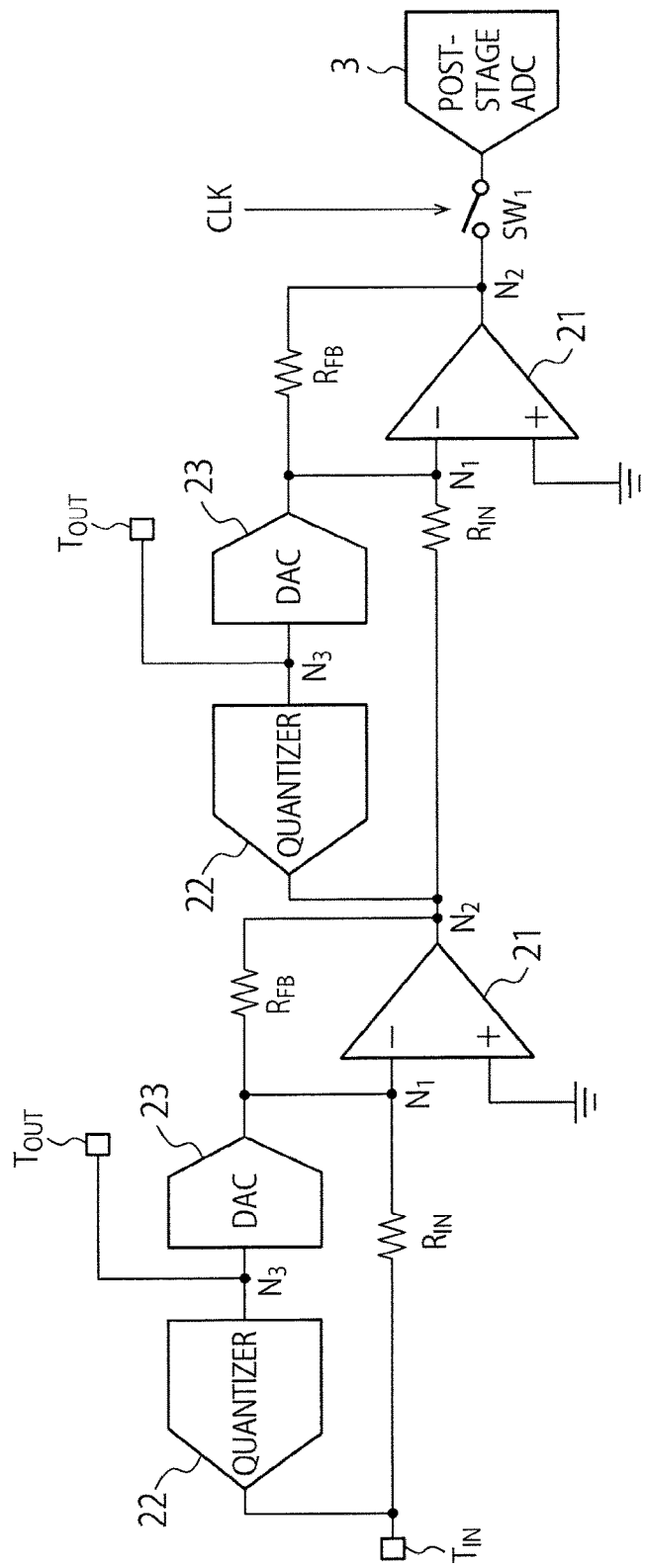
FIG. 11 is a diagram showing a modification example of the analog front end according to the first embodiment.

Further, as shown in FIG. 11, the AFE according to the present embodiment may have a plurality of A/D converters 2 connected in cascade. This makes it possible to further reduce the resolution of the post-stage A/D converter 3 without increasing the resolution of each A/D converter 2. For example, in the AFE of FIG. 11, when the A/D converter 2 in the 1st stage has a resolution of N bits and the A/D converter 2 in the 2nd stage has a resolution of M bits, the resolution of the post-stage A/D converter 3 can be reduced by N+M bits.

In the example of FIG. 11, the AFE has two A/D converters 2, but may have three or more A/D converters 2. Further, the resolution of each A/D converter 2 may be the same or may be different. The configuration of FIG. 11 can be realized by forming the A/D converters 2 using an operational amplifier of a VGA and an operational amplifier of a buffer, or using a plurality of operational amplifiers of a high-order anti-aliasing filter.

Furthermore, the A/D converter 2 according to the present embodiment can be made as a differential A/D converter.

Second Embodiment

Figure 12:
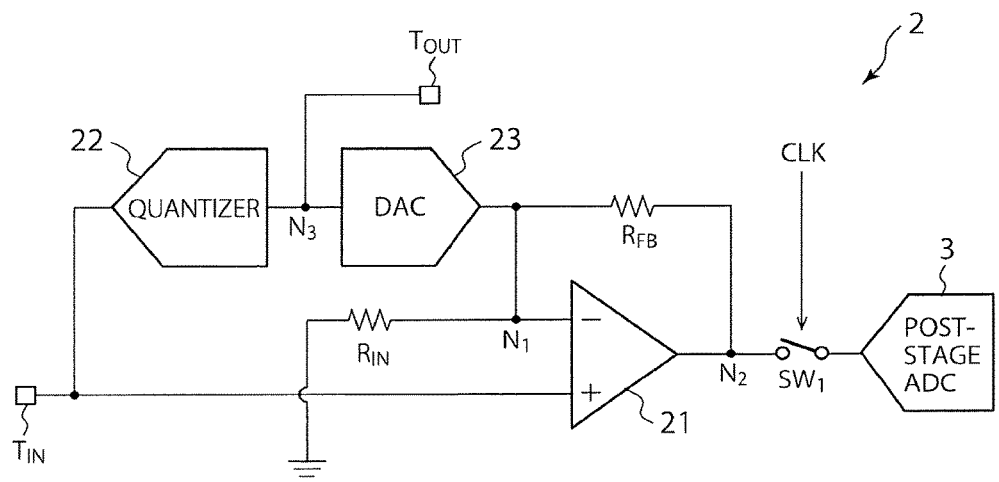
FIG. 12 is a diagram showing an example of an analog front end according to a second embodiment.

The sensor system according to a second embodiment will be explained referring to FIG. 12. In the first embodiment, the operational amplifier 21 is used to form an inverting amplifier circuit. In the present embodiment, explanation will be given on the A/D converter 2 when the operational amplifier 21 is used to form a non-inverting amplifier circuit. FIG. 12 is a diagram showing an example of an AFE according to the present embodiment.

As shown in FIG. 12, in the present embodiment, the input resistance $R_{IN}$ has one end which is not connected to the input terminal $T_{IN}$ but to the reference voltage line. Further, the operational amplifier 21 has a non-inverting input terminal which is not connected to the reference voltage line but to the input terminal $T_{IN}$. The other components are similar to those of the first embodiment.

With such a configuration, the A/D converter 2 according to the present embodiment can operate similarly to the first embodiment. That is, the A/D converter 2 outputs the digital signal $D_{OUT}$ depending on the input signal $V_{IN}$ from the output terminal $T_{OUT}$, and outputs the residual signal $V_{OUT}$ from the node $N_2$ (analog output terminal).

Note that, in the present embodiment, since the operational amplifier 21, input resistance $R_{IN}$, and feedback resistance $R_{FB}$ are included in the non-inverting amplifier circuit, the polarity of the residual signal $V_{OUT}$ becomes inverse to that of the first embodiment. That is, the transmission characteristics of the A/D converter 2 according to the present embodiment become the same as the transmission characteristics of the conventional pipeline stage.

Therefore, according to the present embodiment, the A/D conversion result of the input signal $V_{IN}$ is obtained by summing up the digital signal $D_{OUT}$ outputted by the A/D converter 2 and the digital signal obtained by performing A/D conversion on the residual signal $V_{OUT}$ by the post-stage A/D converter 3.

As stated above, in the present embodiment, there is no need to perform signal processing for inverting the digital signal outputted by the post-stage A/D converter 3 (or residual signal outputted by the A/D converter 2 $V_{OUT}$). This makes it possible to simplify signal processing and to reduce the circuit scale of the AFE.

Third Embodiment

The sensor system according to a third embodiment will be explained referring to FIGS. 13 to 19. In the present embodiment, explanation will be given on the A/D converter 2 capable of restraining a settling error occurring when the residual signal $V_{OUT}$ is switched.

Figure 13:
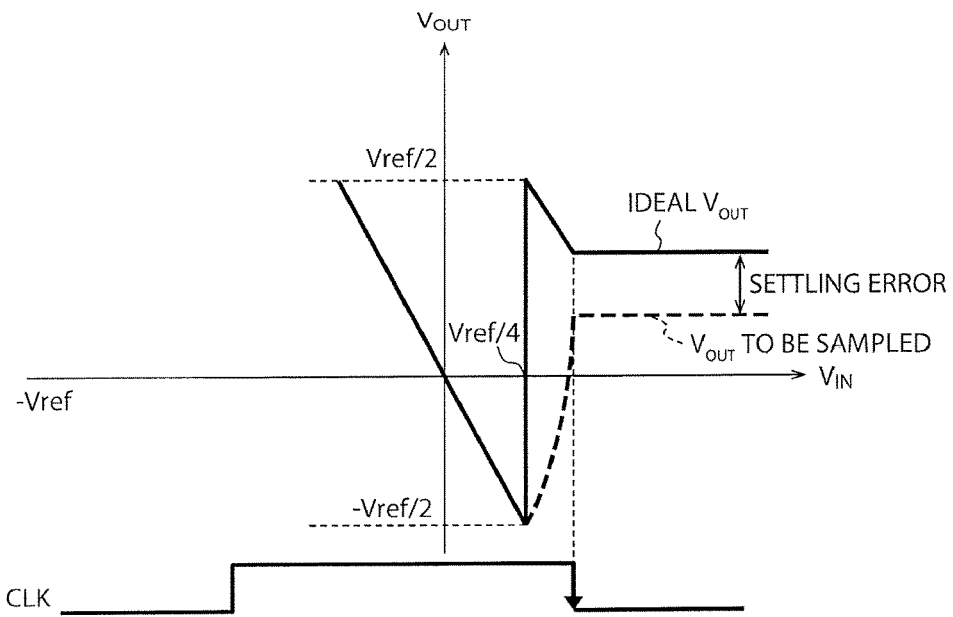
FIG. 13 is a diagram explaining a settling error.

First, the settling error will be explained referring to FIG. 13. FIG. 13 is a diagram explaining the settling error. The following explanation is based on the definition that the switch $SW_1$ of the AFE is turned on while the clock CLK is 1, and turned off while the clock CLK is 0.

The A/D converter 2 outputs the residual signal $V_{OUT}$ depending on the input signal $V_{IN}$ in continuous time. When the switch $SW_1$ is opened and closed as stated above, the residual signal $V_{OUT}$ at the moment when the clock CLK falls is sampled by the post-stage A/D converter 3 and undergoes A/D conversion. As described above, when the input signal $V_{IN}$ exceeds $-Vref/4$ and $Vref/4$, the residual signal $V_{OUT}$ is discretely switched from $-Vref/2$ to $Vref/2$. Here, a case where the clock CLK falls immediately after the residual signal $V_{OUT}$ is switched will be discussed.

For example, as shown in FIG. 13, when the input signal $V_{IN}$ exceeds $Vref/4$, the digital signal $D_{OUT}$ is switched from 00 to 10, and the residual signal $V_{OUT}$ is switched from $-Vref/2$ to $Vref/2$.

When the operational amplifier 21 has an infinite slew rate, the residual signal $V_{OUT}$ is switched instantaneously as shown by a solid line in FIG. 13. Therefore, even when the clock CLK falls immediately after the input signal $V_{IN}$ exceeds $Vref/4$, the post-stage A/D converter 3 can sample the residual signal $V_{OUT}$ ideally.

However, the operational amplifier 21 actually has a finite slew rate, and settling occurs when the residual signal $V_{OUT}$ is switched, as shown by a broken line in FIG. 13. Accordingly, when the clock CLK falls immediately after the input signal $V_{IN}$ exceeds $Vref/4$, the post-stage A/D converter 3 samples the residual signal $V_{OUT}$ in the middle of the settling. An error between an ideal residual signal $V_{OUT}$ and the residual signal $V_{OUT}$ sampled in the middle of the settling is defined as a settling error.

When the post-stage A/D converter 3 performs A/D conversion on the residual signal $V_{OUT}$ having the settling error, an error depending on the settling error occurs in the A/D conversion result. As a result, accuracy of the A/D conversion to be performed on the input signal $V_{IN}$ deteriorates. Improving the slew rate of the operational amplifier 21 to shorten the time required for settling (hereinafter referred to as "settling time") makes it possible to restrain the settling error, but increases the power consumption of the operational amplifier 21.

Figure 14:
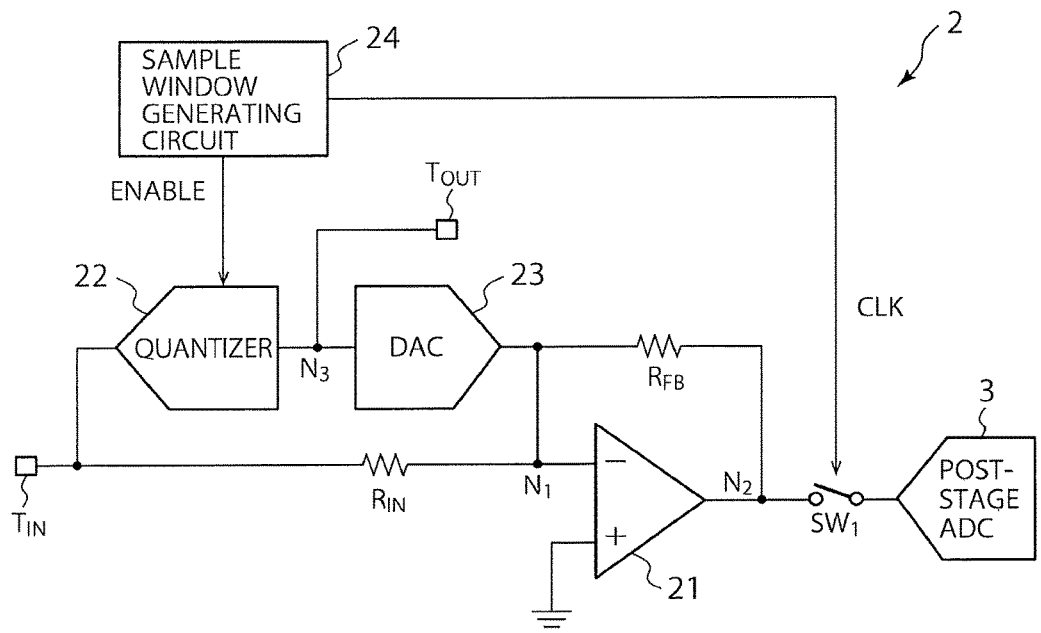
FIG. 14 is a diagram showing an example of an analog front end according to a third embodiment.

The A/D converter 2 according to the present embodiment is provided to restrain the above settling error without changing the slew rate of the operational amplifier 21. FIG. 14 is a diagram showing an example of an AFE according to the present embodiment. As shown in FIG. 14, the A/D converter 2 has a sample window generating circuit 24. The other components are similar to those of the first embodiment.

The sample window generating circuit 24 (hereinafter referred to as "generator circuit 24") generates a control signal ENABLE, and inputs it into the quantizer 22. The generator circuit 24 controls the operation of the quantizer 22 by the control signal ENABLE. Concretely, the generator circuit 24 controls the quantizer 22 so that the digital signal $D_{OUT}$ cannot be switched during a predetermined period (hereinafter referred to as "non-transition period") including the moment when the switch SW1 is turned on, i.e., the moment when the clock CLK falls.

Figure 15:
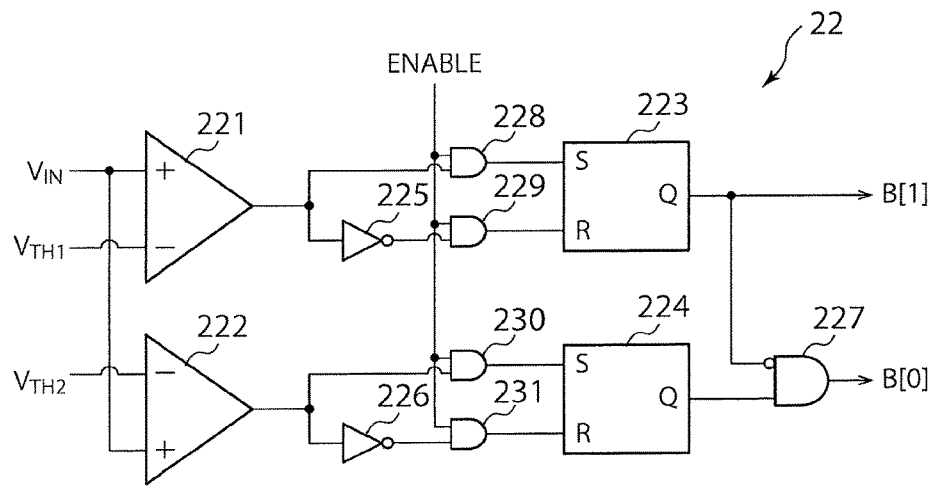
FIG. 15 is a diagram showing an example of a quantizer according to the third embodiment.

The control signal ENABLE is e.g. a signal which has a value of 0 during the non-transition period. FIG. 15 is a diagram showing an example of the quantizer 22 when using such a control signal ENABLE. The quantizer 22 of FIG. 15 has AND gates 228 to 230. The other components are similar to those of the quantizer 22 of FIG. 4.

The AND gate 228 has one input terminal inputted with the control signal ENABLE and the other input terminal inputted with the output signal of the comparator 221. The output signal of the AND gate 228 is inputted into the S terminal of the SR latch 223.

The AND gate 229 has one input terminal inputted with the control signal ENABLE and the other input terminal inputted with the output signal of the NOT gate 225. The output signal of the AND gate 229 is inputted into the R terminal of the SR latch 223.

The AND gate 230 has one input terminal inputted with the control signal ENABLE and the other input terminal inputted with the output signal of the comparator 222. The output signal of the AND gate 230 is inputted into the S terminal of the SR latch 224.

The AND gate 231 has one input terminal inputted with the control signal ENABLE and the other input terminal inputted with the output signal of the NOT gate 226. The output signal of the AND gate 231 is inputted into the R terminal of the SR latch 224.

When the control signal ENABLE has a value of 1, the quantizer 22 of FIG. 15 operates similarly to the quantizer 22 of FIG. 4. That is, the digital signal $D_{OUT}$ is switched depending on the input signal $V_{IN}$. On the other hand, when the control signal ENABLE has a value of 0, the value of Q of each of the SR latches 223 and 224 in the quantizer 22 of FIG. 15 remains the same since S=R=0. That is, the digital signal $D_{OUT}$ cannot be switched.

As stated above, the quantizer 22 of FIG. 15 is inputted with the control signal ENABLE having a value of 0 during the non-transition period, which makes it impossible to switch the digital signal $D_{OUT}$ outputted by the quantizer during the non-transition period.

Figure 16:
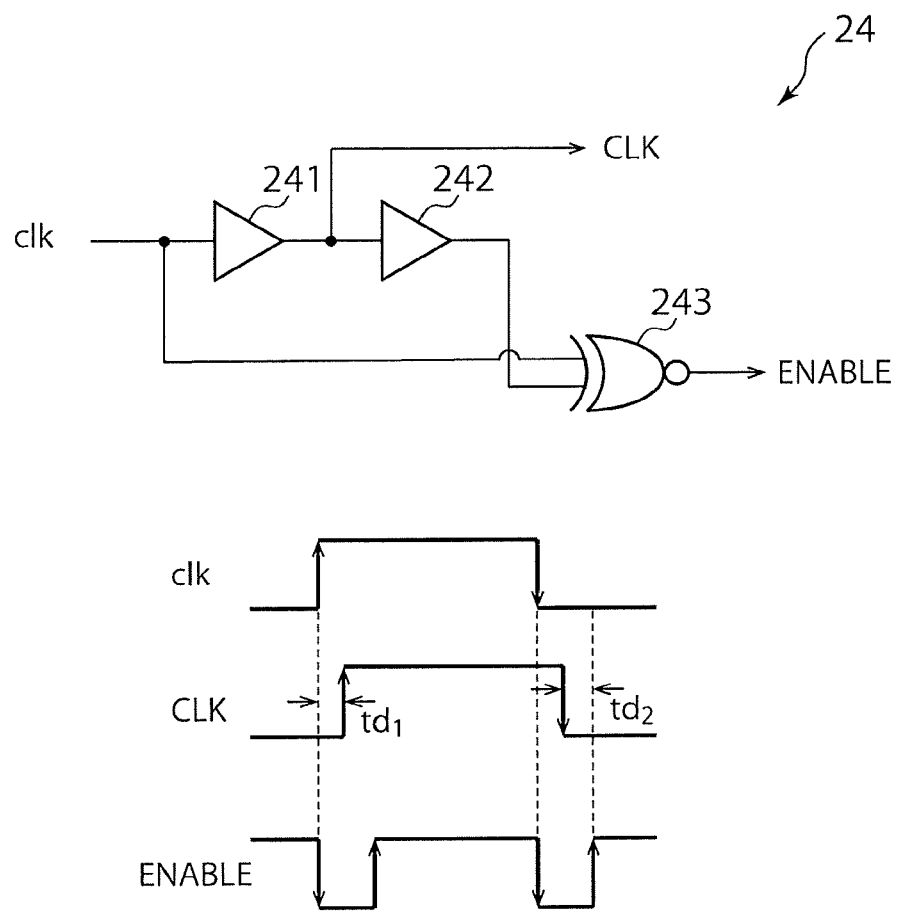
FIG. 16 is a diagram showing an example of a sample window generating circuit.

FIG. 16 is a diagram showing an example of the generator circuit 24 which generates the control signal ENABLE having a value of 0 during the non-transition period. As shown in FIG. 16, this generator circuit 24 has buffers 241 and 242 and an XNOR gate 243.

The buffer 241 is a delay element having a delay time td1. When inputted with a clock clk, the buffer 241 delays the inputted clock clk by the delay time td1 and outputs it. The clock clk is inputted from a PLL, for example. As shown in FIG. 16, the clock delayed by the buffer 241 by the delay time td1 becomes a clock $SW_1$ which controls on and off of the switch $SW_1$.

The buffer 242 is a delay element having a delay time td2. When inputted with the clock clk delayed by the buffer 242 (i.e., the clock CLK), the buffer 242 delays the inputted clock clk by the delay time td2 and outputs it.

The XNOR gate 243 has one input terminal inputted with the clock clk and the other input terminal inputted with the clock clk delayed by the buffer 242 (i.e., the clock CLK delayed by the delay time td2). The output signal of the XNOR gate 243 becomes the control signal ENABLE.

The XNOR gate 243 outputs 1 when both of the input terminals are inputted with 1 or 0, and outputs 0 in the other cases. Therefore, as shown in FIG. 16, the control signal ENABLE has a value of 0 during a period from td1 before the falling of the clock CLK until td2 after the falling of the clock CLK. This period is the non-transition period including the moment when the clock CLK falls. In this way, the generator circuit 24 can generate the control signal ENABLE having the non-transition period.

Note that, as shown in FIG. 16, in this generator circuit 24, a period from td1 before the rising of the clock CLK until td2 after the rising of the clock CLK also becomes the non-transition period. In order to prevent the occurrence of the non-transition period including the moment when the clock CLK rises, a D flip-flop circuit should be used as shown in FIG. 17.

Figure 17:
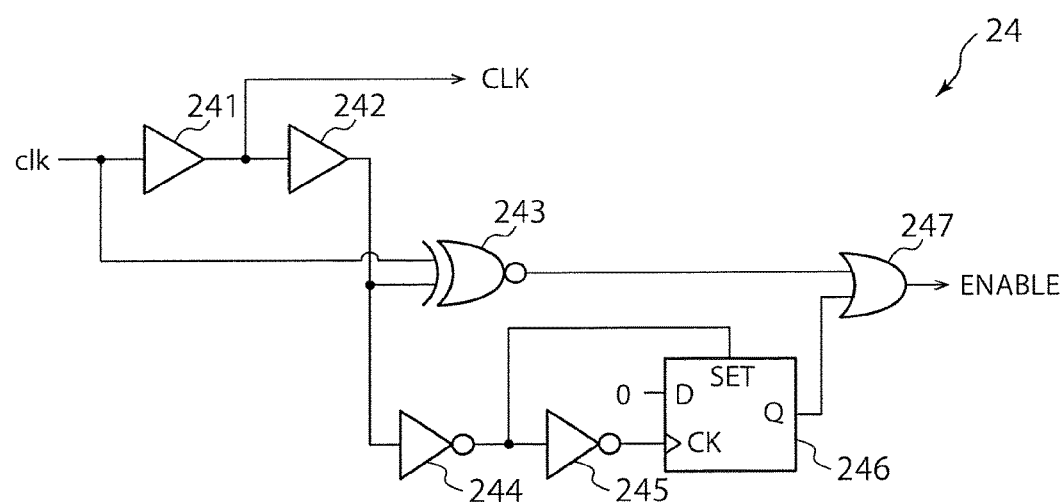
FIG. 17 is a diagram showing another example of the sample window generating circuit.
Figure 17:
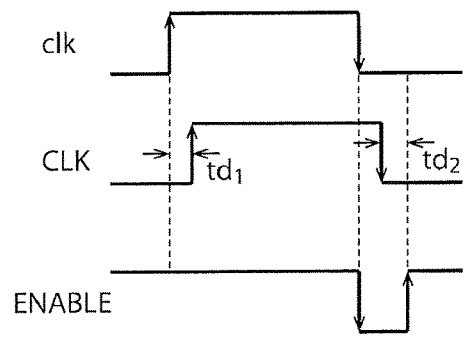

FIG. 17 is a diagram showing another example of the generator circuit 24. As shown in FIG. 17, this generator circuit 24 has NOT gates 244 and 245, a D flip-flop circuit 246, and an OR gate 247. The other components are similar to those of the generator circuit 24 of FIG. 16.

The NOT gate 244 is inputted with the clock clk delayed by the buffer 242 (i.e., the clock CLK delayed by the delay time td2), and outputs an inverted signal thereof. The NOT gate 245 is inputted with the output signal of the NOT gate 245, and outputs an inverted signal thereof.

The D flip-flop circuit 246 has a clock terminal inputted with the output signal of the NOT gate 245, a D terminal inputted with 0, and a SET terminal inputted with the output signal of the NOT gate 244.

The OR gate 247 has one input terminal inputted with the output signal of the XNOR gate 243 and the other input terminal inputted with the output signal of the D flip-flop circuit 246.

With such a configuration, the generator circuit 24 can generate the control signal ENABLE in which a period from td1 before the rising of the clock CLK until td2 after the rising of the clock CLK does not become the non-transition period.

Note that the control signal ENABLE, quantizer 22, and generator circuit 24 should not be limited to the above. The generator circuit 24 can be arbitrarily formed to control the quantizer 22 so that the digital signal $D_{OUT}$ cannot be switched during the non-transition period including the moment when the clock CLK falls.

Figure 18:
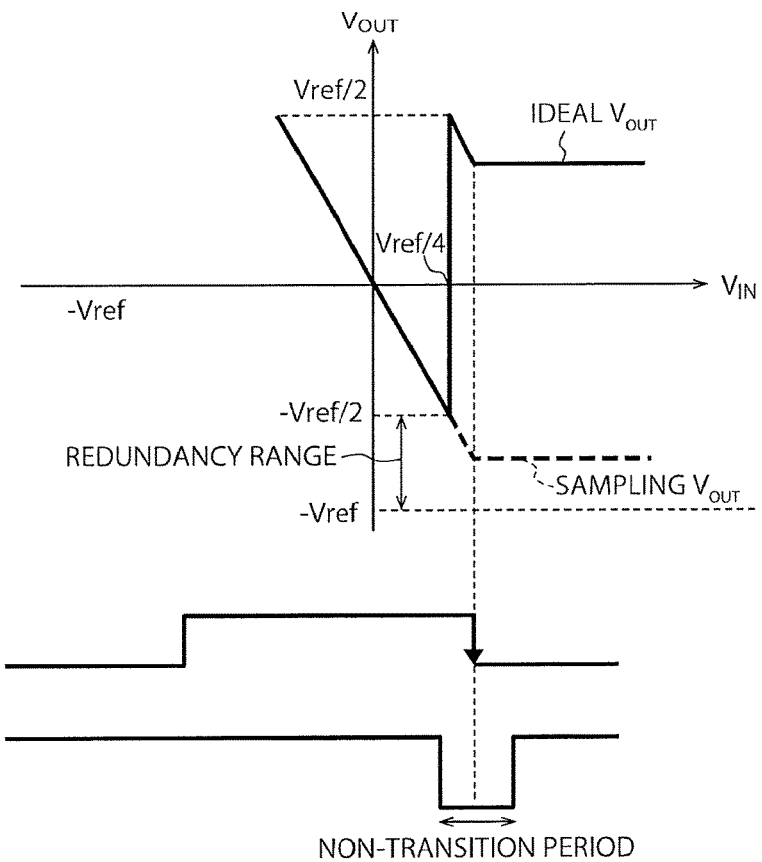
FIG. 18 is a diagram explaining the operation of the analog front end according to the third embodiment.

Here, the operation of the AFE according to the present embodiment will be explained referring to FIG. 18. FIG. 18 is a diagram explaining the operation of the AFE according to the present embodiment. In the present embodiment, as described above, the digital signal $D_{OUT}$ outputted by the quantizer 22 cannot be switched during the predetermined non-transition period including the moment when the clock CLK falls. Accordingly, during the non-transition period, the residual signal $V_{OUT}$ also cannot be switched, and thus settling of the residual signal $V_{OUT}$ does not occur.

For example, as shown in FIG. 18, even when the clock CLK falls immediately after the input signal $V_{IN}$ exceeds Vref/4, the residual signal $V_{OUT}$ cannot be switched from −Vref/2 to Vref/2.

In this way, settling of the residual signal $V_{OUT}$ does not occur during the non-transition period, which makes it possible to restrain the post-stage A/D converter 3 from sampling the residual signal $V_{OUT}$ in the middle of the settling. Therefore, the AFE according to the present embodiment makes it possible to restrain the settling error and perform A/D conversion on the input signal $V_{IN}$ with high accuracy.

Note that, in the present embodiment, the digital signal $D_{OUT}$ can be switched at any time out of the non-transition period. This means that the residual signal $V_{OUT}$ also can be switched, and settling occurs. However, this has no influence on the A/D conversion performed by the post-stage A/D converter 3 since the residual signal $V_{OUT}$ is not sampled if not in the non-transition period.

Further, in the present embodiment, as shown in FIG. 18, when the clock CLK falls immediately after the input signal $V_{IN}$ exceeds Vref/4, the residual signal $V_{OUT}$ to be sampled by the post-stage A/D converter 3 is lower than −Vref/2. The residual signal $V_{OUT}$ actually sampled becomes lower than the ideal residual signal $V_{OUT}$ by Vref.

However, the error between the ideal residual signal $V_{OUT}$ discussed here and the residual signal $V_{OUT}$ actually sampled has no influence on the A/D conversion performed on the input signal $V_{IN}$. This is because the A/D converter 2 has a redundancy. In the example of FIG. 18, a redundancy range of Vref/2 is provided for the residual signal $V_{OUT}$. Even when the residual signal $V_{OUT}$ is lower than −Vref/2, the AFE can perform A/D conversion on the input signal $V_{IN}$ with high accuracy as long as the residual signal $V_{OUT}$ is within the redundancy range.

Figure 19:
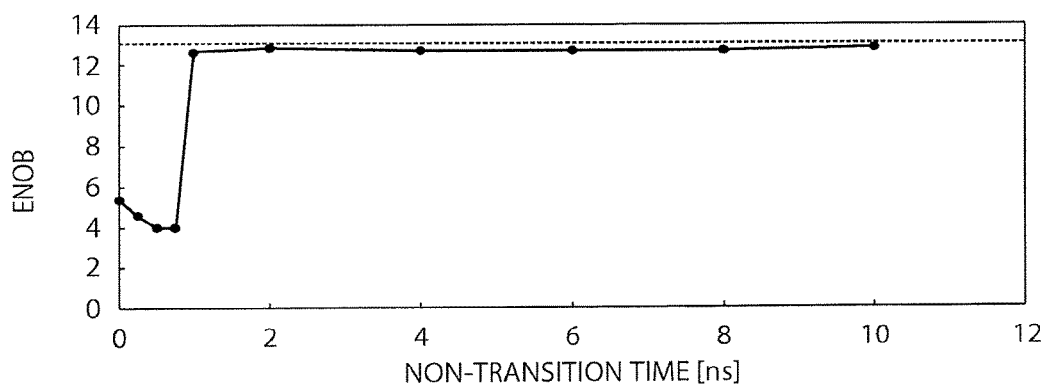
FIG. 19 is a graph showing a simulation result of the analog front end according to the third embodiment.

FIG. 19 is a graph showing a simulation result of the AFE according to the present embodiment. In the example of FIG. 19, the A/D converter 2 has a resolution of 1.5 bits, and the post-stage A/D converter 3 has a resolution of 12 bits. That is, 13 is the ideal effective number of bits of the AFE.

Further, in the example of FIG. 19, the post-stage A/D converter 3 has a sampling frequency of 10 MHz, and the input signal $V_{IN}$ has a frequency of 1 MHz. In the graph of FIG. 19, the vertical axis represents the effective number of bits (ENOB), and the horizontal axis represents non-transition time (ns). Here, the non-transition time shows the length of the non-transition period. For example, in the example of FIG. 16, the non-transition time is obtained by adding td1 and td2.

As a result of a simulation, as shown in FIG. 19, when the non-transition time is shorter than 1 ns, the effective number of bits gets small. This is probably since the non-transition time shorter than the settling time is not enough to sufficiently restrain the settling error.

On the other hand, when the non-transition time is equal to or longer than 1 ns, the effective number of bits has a value (13 bits) close to the ideal value. This is probably since the non-transition time longer than the settling time is enough to restrain the settling error. That is, in the present embodiment, it is desirable that the non-transition time is set longer than the settling time of the operational amplifier 21.

The example of FIG. 19 shows that setting the non-transition time to be equal to or longer than 1 ns makes it possible for the AFE according to the present embodiment to restrain the settling error and perform A/D conversion on the input signal $V_{IN}$ with high accuracy.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An A/D converter comprising:
an analog input terminal to input an analog input signal;
an analog output terminal to output an analog output signal;
a digital output terminal to output a digital output signal;
a first resistance comprising one end connected to the analog input terminal or a reference voltage line and another end connected to a first node;
a second resistance comprising one end connected to the first node and another end connected to the analog output terminal;
an operational amplifier comprising a first input terminal connected to the first node, a second input terminal connected to the reference voltage line or the analog input terminal, and an output terminal connected to the analog output terminal;
a quantizer comprising an input terminal connected to the analog input terminal and an output terminal connected to the digital output terminal; and
a DA converter comprising an input terminal connected to the digital output terminal and an output terminal connected to the first node.

2. The A/D converter of claim 1, wherein the digital output signal has a redundant bit.

3. The A/D converter of claim 1, wherein the quantizer has a resolution of 1.5 bits, 2.5 bits, or 3.5 bits.

4. The A/D converter of claim 1, wherein at least one of the first resistance and the second resistance has a variable resistance value.

5. The A/D converter of claim 1, further comprising a capacitor comprising one end connected to the analog output terminal and another end connected to a reference voltage line.

6. An analog front end comprising:
an A/D converter;
a post-stage A/D converter connected to a post-stage of the A/D converter; and
a switch connected between the A/D converter and the post-stage A/D converter,
wherein the A/D converter comprises:
an analog input terminal to input an analog input signal;
an analog output terminal to output an analog output signal;
a digital output terminal to output a digital output signal;
a first resistance comprising one end connected to the analog input terminal or a reference voltage line and another end connected to a first node;
a second resistance comprising one end connected to the first node and another end connected to the analog output terminal;
an operational amplifier comprising a first input terminal connected to the first node, a second input terminal connected to the reference voltage line or the analog input terminal, and an output terminal connected to the analog output terminal;
a quantizer comprising an input terminal connected to the analog input terminal and an output terminal connected to the digital output terminal; and
a DA converter comprising an input terminal connected to the digital output terminal and an output terminal connected to the first node.

7. The analog front end of claim 6, wherein the analog front end comprises a plurality of the A/D converters connected in cascade.

8. The analog front end of claim 6, wherein the A/D converter functions as at least one of a variable gain amplifier, a buffer, and a filter.

9. The analog front end of claim 6, further comprising a generator circuit to generate a control signal which makes it impossible to switch a digital signal outputted by the quantizer during a predetermined period including a moment when the switch is turned on.

10. The analog front end of claim 9, wherein the predetermined period is longer than a settling time of the analog output signal.

11. The analog front end of claim 9, wherein the digital output signal has a redundant bit.

12. The analog front end of claim 9, wherein the quantizer has a resolution of 1.5 bits, 2.5 bits, or 3.5 bits.

13. The analog front end of claim 9, wherein at least one of the first resistance and the second resistance has a variable resistance value.

14. The analog front end of claim 9, further comprising a capacitor comprising one end connected to the analog output terminal and another end connected to a reference voltage line.

15. A sensor system comprising:
a sensor to output an analog signal; and
an analog front end,
wherein the analog front end comprises:
an A/D converter;
a post-stage A/D converter connected to a post-stage of the A/D converter; and
a switch connected between the A/D converter and the post-stage A/D converter,
the A/D converter comprises:
an analog input terminal to input an analog input signal;
an analog output terminal to output an analog output signal;
a digital output terminal to output a digital output signal;

a first resistance comprising one end connected to the analog input terminal or a reference voltage line and another end connected to a first node;

a second resistance comprising one end connected to the first node and another end connected to the analog output terminal;

an operational amplifier comprising a first input terminal connected to the first node, a second input terminal connected to the reference voltage line or the analog input terminal, and an output terminal connected to the analog output terminal;

a quantizer comprising an input terminal connected to the analog input terminal and an output terminal connected to the digital output terminal; and a DA converter comprising an input terminal connected to the digital output terminal and an output terminal connected to the first node, and the analog signal outputted by the sensor is inputted into the analog front end as an analog input signal.

16. The sensor system of claim 15, wherein the digital output signal has a redundant bit.

17. The sensor system of claim 15, wherein the quantizer has a resolution of 1.5 bits, 2.5 bits, or 3.5 bits.

18. The sensor system of claim 15, wherein at least one of the first resistance and the second resistance has a variable resistance value.

19. The sensor system of claim 15, further comprising a capacitor comprising one end connected to the analog output terminal and another end connected to a reference voltage line.

* * * * *